United States Patent [19]

Matlock

[11] Patent Number: 5,429,958
[45] Date of Patent: Jul. 4, 1995

[54] PROCESS FOR FORMING TWIN WELL CMOS INTEGRATED CIRCUITS

[75] Inventor: Dyer A. Matlock, Melbourne, Fla.

[73] Assignee: Harris Corporation, Melbourne, Fla.

[21] Appl. No.: 80,744

[22] Filed: Jun. 22, 1993

Related U.S. Application Data

[60] Division of Ser. No. 928,992, Aug. 12, 1992, Pat. No. 5,247,199, which is a continuation of Ser. No. 354,844, May 22, 1989, abandoned, which is a continuation of Ser. No. 5,956, Jan. 22, 1987, abandoned, which is a continuation-in-part of Ser. No. 819,042, Jan. 15, 1986, abandoned.

[51] Int. Cl.$^6$ .......................... H01L 21/8238
[52] U.S. Cl. .......................... 437/34; 437/44; 437/41; 437/56; 437/190; 148/DIG. 82
[58] Field of Search .......... 437/34, 44, 56, 57, 437/59, 190, 45, 41, 192, 40, 58; 148/DIG. 82

[56] References Cited

U.S. PATENT DOCUMENTS

| | | | |
|---|---|---|---|
| 4,343,082 | 8/1982 | Lepselter et al. | 437/41 |
| 4,356,623 | 11/1982 | Hunter | 437/44 |
| 4,488,351 | 12/1984 | Momose | 437/41 |
| 4,490,736 | 12/1984 | McElroy | 437/34 |
| 4,590,663 | 5/1986 | Haken | 437/34 |
| 4,599,789 | 7/1986 | Gasner | 437/57 |
| 4,717,684 | 1/1988 | Katto et al. | 437/57 |
| 4,755,480 | 7/1988 | Yau et al. | 437/190 |
| 4,760,033 | 7/1988 | Mueller | 437/57 |
| 4,761,384 | 8/1988 | Neppl et al. | 148/DIG. 82 |
| 5,086,006 | 2/1992 | Asahina | 437/57 |

FOREIGN PATENT DOCUMENTS 0200418  11/1984  Japan ...................... 437/44

OTHER PUBLICATIONS

Rung et al., "A Retrograde p-Well for Higher Density CMOS", IEEE Trans. on Elect. Dev., vol. ED-28, No. 10, Oct. 1981, pp. 1115-1119.

Primary Examiner—Brian E. Hearn
Assistant Examiner—Tuan Nguyen
Attorney, Agent, or Firm—Charles Wands

[57] ABSTRACT

A process of forming complementary insulated gate field effect transistors includes forming first and second well regions of first and second conductivity types in a planar semiconductor layer so that the well regions have an impurity retrograde impurity distribution profile. An insulator layer is then selectively formed with a first relatively thick insulator portion and thin gate portions. The first and second gates are formed on the relatively thin portions of the insulator layer. Insulator spacers are formed so as to extend laterally from the gates and from the relatively thick insulator portion. First impurities are introduced using the first gate and spacers as a mask to form first source and drain regions. Second impurities of an opposite conductivity type are introduced using the second gate and spacers as a mask to form source and drain regions of a complementary device.

24 Claims, 3 Drawing Sheets

PROCESS FOR FORMING TWIN WELL CMOS INTEGRATED CIRCUITS

CROSS REFERENCE TO RELATED APPLICATION

The present application is a division of U.S. patent application Ser. No. 07/928,992, filed Aug. 12, 1992, now U.S. Pat. No. 5,247,199, issued Sep. 21, 1993, which is a continuation of U.S. patent application Ser. No. 07/354,844, filed May 22, 1989, now abandoned, which is a continuation of U.S. patent application Ser. No. 07/005,956, filed Jan. 22, 1987, now abandoned, which is a continuation-in-part of U.S. patent application Ser. No. 06/819,042, filed Jan. 15, 1986, now abandoned.

FIELD OF THE INVENTION

The present invention relates in general to integrated circuits and is particularly directed to an improved methodology for forming complementary insulated gate field effect transistors having radiation hardened field and gate oxides.

BACKGROUND OF THE INVENTION

The continuing evolution of integrated circuit technology has witnessed refinements in integrated density, performance and robustness against severe (e.g. radiation) environments. In the course of this development the microelectronics industry has achieved semiconductor wafer implementations of increased (functional) complexity circuits, intended to operate at enhanced signal processing speeds, known as very high speed integrated circuits. Because of the number of critical performance requirements that have been placed on these designs (e.g. survivability in severe operating environments, signal processing power, increased system complexity, and wafer mapping capability), the processing methodology of very high speed integrated circuits has had placed upon it a large number of demands not heretofore encountered in semiconductor fabrication technology.

SUMMARY OF THE INVENTION

In accordance with the present invention, there is provided a new and improved semiconductor processing methodology and integrated circuit structure that is particularly suited to meeting the demands for a radiation-hardened, very high speed integrated circuit structure and processing methodology that offers to the industry a significantly enhanced mechanism for increased circuit density and performance as applied to system/subsystem wafer fabrication.

Pursuant to the inventive process, complementary insulated field effect transistors (typically interconnected as an inverter circuit) are manufactured by forming twin (opposite conductivity) wells in respective surface portions of the planar surface of an epitaxial semiconductor (silicon) layer. Radiation hardening of the structure involves a consideration of radiation dose rate tolerance and total dosage. Robustness to high dose rate is effected by forming the twin wells so as to have retrograde impurity distribution profiles. These retrograde characteristics also serve to optimize the capacitances of PN junctions formed with the well material and thereby effectively minimize device latch-up (due to the presence of parasitic bipolar devices).

Hardening of the structure against radiation-induced charge and a consequential change in voltage required to induce a channel in the surface of underlying semiconductor material involves the formation of a hardened thin gate insulator layer and a thick field oxide layer having a laminate of a first, thermally grown oxide atop which a second oxide layer is deposited.

Because the effective hardening characteristics of the field oxide depend upon the uniformity of the thickness of each of the first and second oxide portions of the field oxide laminate (both in terms of thickness ratio and total thickness), it is essential that the underlying semiconductor material have a planar surface. For either a LOCOS (local oxidation of silicon) process or an etch, backfill-growth and deposit process the periphery of the field oxide layer adjacent to the well regions would be tapered (e.g. bird's beak for LOCOS process) resulting in a change in the hardening parameters of the field oxide laminate at that point. In effect, the tapering may result in a decrease in the overall thickness of the field oxide at the periphery, and consequently a reduction in field voltage, or a change in the required ratio of thickness of the deposited oxide layer to the thermally grown oxide layer, or both. Employing a planar-surfaced substrate avoids this problem.

Now, although the dual layer field oxide laminate structure overlying a planar-surfaced substrate provides requisite field hardness, its substantial thickness does not readily lend itself to small lithography topologies. To circumvent this potential problem, tapered oxide spacers are formed at the sidewalls of the field oxide and gate structure. The spacers reduce hot electron and substrate current injection problems and improve metallization interconnect coverage by providing a more gradually contoured surface.

Hardening of the gate oxide layer is accomplished by the use of a thin (on the order of 200–300 Å) oxide layer, which is formed on a prescribed gate region portion of each of the twin retrograde wells through respective openings in the hardened field oxide, exposing surface areas where the source, drain and gate regions of the respective complementary transistors are to be formed. Thick polysilicon layers are formed atop the thin gate oxide layers and shallow source and drain regions of each transistors are formed in the twin wells, self-aligned with the polysilicon gates. After formation of the shallow source and drain regions, oxide spacers are formed adjacent to the sidewalls of the hardened field oxide and the polysilicon gates. Because of the substantial thickness of the polysilicon gate material all oxide spacers may be formed during the same processing step.

Following formation of the oxide spacers, additional impurities are introduced into the source and drain regions (now using the oxide spacers as a mask), to form a deeper profile. During this step, the polysilicon gates are also doped, to thereby set the conductivities of the gates of the respective FETs. Because the resulting twin well configuration employs dual polarity (conductivity) gates, the breakdown voltage for each device is increased.

A refractory metal (e.g. tungsten), to be used as an interconnect contact layer, is then selectively deposited on exposed silicon areas of the structure (both the monocrystalline silicon of the source/drain regions and the polycrystalline silicon gates and a polysilicon interconnect track provided on the field oxide between the twin wells). Because of the presence of the refractory layer atop each source/drain region and the polysilicon layers, the sheet resistance of the polysilicon is significantly decreased. In addition, because the refractory metal covers the entirety of the exposed surface of the twin wells where the source/drain impurities are introduced, problems associated with small area source and drain contacts are reduced.

Deposition of the refractory metal layer is followed by the formation of a multilevel metallized interconnect structure which improves packing density and offers reduced capacitance and resistance compared to a conductor structure using only polysilicon highways. The multilevel interconnect configuration employs a planarized insulator layer, openings in which expose the refractory metal layers on the source/drain regions and the polysilicon drain interconnect layer atop the field oxide. Refractory metal plugs which contact the underlying tungsten layer occupy a substantial volume of the openings. An adhesion metal (e.g. one containing titanium) is formed over the planarized oxide layer and extends onto the refractory metal plugs in the oxide openings.

Atop the adhesion metal layer is a first metal (electroplated gold) interconnect layer providing respective contact tracks to each source region and joining together the two drain regions. A second level of interconnect, similar to the first level (i.e. employing planarized oxide, adhesion metal and a second plated gold layer) is then selectively formed atop the first level of interconnect to complete the conductive path connections of the CMOS inverter.

Because gold is preferably employed as the interconnect metal, the multilevel structure enjoys greatly improved electromigration characteristics and reduced resistance as compared to aluminum. Also, because of metallurgical plating properties, gold is readily deposited over any unevenness in the multilevel structure, thereby ensuring contact to all regions of the CMOS device.

DETAILED DESCRIPTION

Referring now to FIGS. 1–7, there are shown respective diagrammatic cross-sectional illustrations of a complementary CMOS device (inverter) at respective stages of its manufacture in accordance with the improved processing methodology of the present invention. The individual steps of the process will be described below with reference to the respective Figures.

Figure 1:
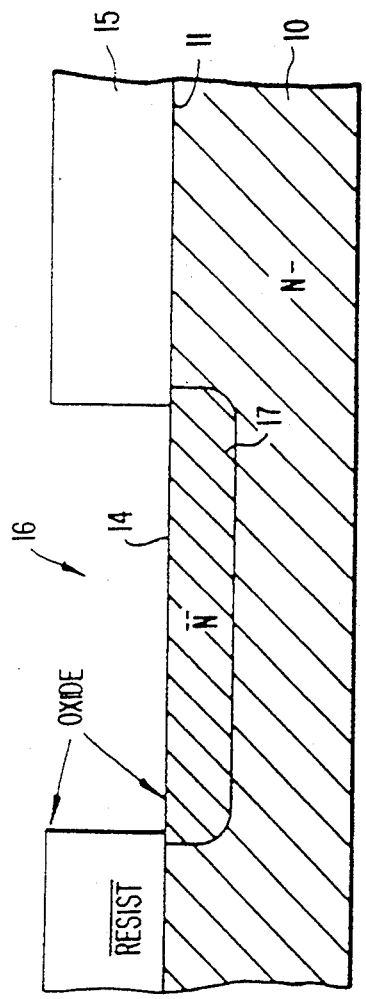
FIGS. 1–7 show respective stages of the manufacture of a very high speed integrated circuit CMOS inverter circuit in accordance with the processing methodology of the present invention.

As shown in FIG. 1, the process begins with the provision of a suitable semiconductor substrate or bulk material, for example an N-type 3–5 ohm cm <100> epitaxial silicon layer 10 that has been grown on a suitable underlying substrate (e.g. a 0.008–0.020 ohm cm silicon substrate, not shown). For the exemplary CMOS inverter of the present example, epitaxial silicon layer 10 may have a thickness on the order of 3.0 $\mu$m.

As noted previously, a requisite characteristic of silicon layer 10 for the successful formation of a radiation hardened field oxide layer is the planarity of surface 11. A planar surface will ensure the necessary controlled thickness ratio and uniformity of the components of the radiation hardened field oxide, to be described below.

After epitaxial layer 10 has been grown on the surface of the underlying substrate, its top planar surface 11 is oxidized to form a thin oxide layer 14 (having a thickness on the order of 475 Å). A suitable implant blocking photoresist 15 having a thickness on the order of 2.0 $\mu$m is formed over the oxide layer 14 and patterned to form a "deep moat" type opening 16 exposing an initial surface area of thin oxide layer 14 overlying the surface 11 of the epitaxial layer 10.

An N-type retrograde well is then formed in the surface of the epitaxial layer 10 exposed by the opening 16 in the photoresist layer 15 by implanting suitable N-type conductivity ions (e.g. phosphorus ions) at respectively decreasing implantation energy levels (e.g. at 500 kV, 275 kV, and 130 kV) to form an N-type 17 having a retrograde impurity distribution profile. At a maximum implantation energy of 500 kV, the peak of the retrograde profile within well 17 is located at a distance of 0.73 $\mu$m from the planar surface 11 of the epitaxial layer 10.

Figure 2:
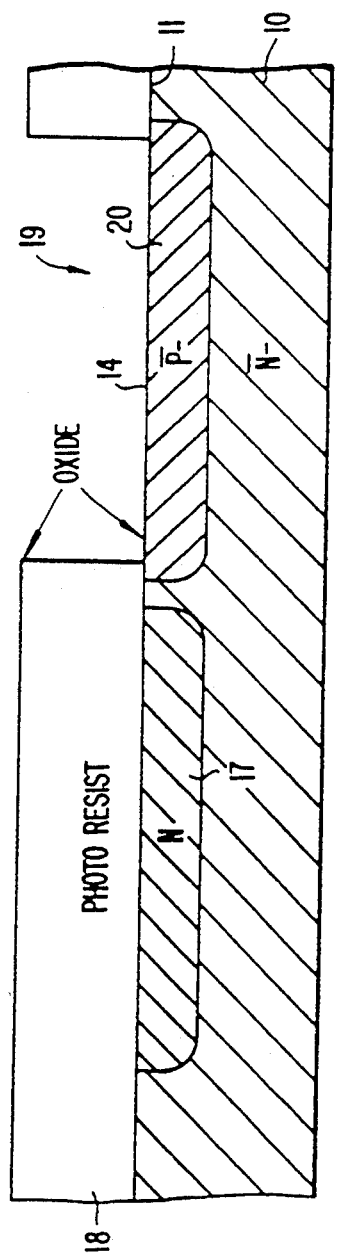

Next, as shown in FIG. 2, a retrograde P-type well is formed in a separate surface portion of substrate 10 by removing the implant blocking photoresist layer 15 and forming an implant blocking photoresist layer 18 on surface 11 of the epitaxial layer 10. Photoresist layer 18 is then selectively patterned to form an opening 19 exposing a portion of thin oxide layer 14 adjacent to N-type well 17. P-type impurities (e.g. boron ions) are then implanted through the "deep-moat" opening 19 in implant blocking photoresist layer 18 so as to form a P-type implanted well region 20 adjacent to N-type well 17. Again, using successively decreasing magnitudes of implant voltage (e.g. 360 kV, 185 kV, 55 kV) for the boron ions, P-type well region 20 has a retrograde impurity distribution profile, yielding a peak at a distance at approximately 0.9 microns from the surface 11 of epitaxial layer 10.

As noted previously, the retrograde characteristics of the impurity distribution profiles of N-type well 17 and the P-type well 20 enhance the dose rate hardness of the transistor. Moreover, the capacitance of the PN junctions formed with the well material can be optimized. Also, the high doping concentration at the bottom of each of wells 17 and 20 reduces inherent silicon controlled rectifier (SCR) shunt resistances. After the formation of the twin well structure shown in FIG. 2, the implant blocking photoresist layer 18 used to form P well 20 and the initial thin oxide layer 14 are removed from the planar surface 11 of the epitaxial layer 10.

Figure 3:
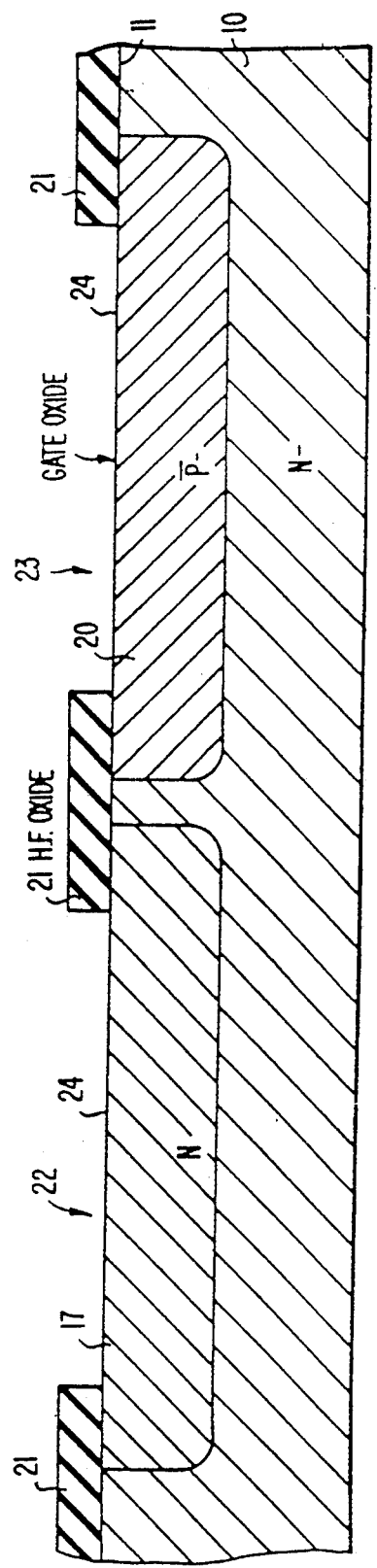

Next, as shown in FIG. 3, a radiation hardened field oxide layer 21, having a thickness on the order of 5,000 Å, is selectively formed on the planar surface 11 of epitaxial layer 10, exposing respective surface areas 22 and 23 of N well 17 and P well 20. Formation of radiation hardened field oxide layer 21 is preferably carried out by a dual thermal oxidation/oxide deposition process as described in an article entitled "A Radiation-Hard Insulator for MOS LSI Devices Isolation", by K. Kasama et al, IEEE Trans. Nucl. Sci., Vol. NS-32 No. 6, December 1985, pps. 3965–3970. As described in that article, field oxide layer 21 has a stack or laminate configuration consisting of a relatively thick phosphosilicate glass layer deposited onto a thin thermally grown silicon dioxide film. The first thin layer is thermally grown at a temperature on the order of 900° C. to a thickness of 40 nm. Atop this first layer a second thick chemical vapor deposition layer of phosphorous-doped silicon dioxide (7 mol % phosphosilicate glass) is deposited to a thickness on the order of 500 nm. The resulting field oxide structure provides a flat band voltage shift ($\Delta V_{FB}$) of no more than 20 volts over a dosage range that exceeds $10^5$ rads (Si).

After formation of the dual-layered laminate radiation hardened field oxide layer 21, a second, thinner radiation hardened gate oxide layer 24 (200–300 Å in thickness) is selectively formed in the exposed areas 22 and 23 overlying the respective N and P wells 17 and 20. For this purpose, gate oxide layer 24 may be formed by thermal oxidation. Because thermally grown gate oxide layer 24 is extremely thin, its capacity to accumulate charge in response to nuclear (e.g. Γ-ray, X-ray) radiation is reduced compared with that of a thick single-layered field oxide. Again, for a detailed discussion of the characteristics of radiation hardened oxides, attention may be directed to the above-referenced article by Kasama et al. In addition, attention may be directed to an article entitled "Radiation Hardened Silicon Devices Using a Novel Thick Oxide" by K. Watanabe, IEEE Trans. Nucl. Sci, Vol. NS-32 No. 6, December 1985, pps. 3971–3974 for a description of the radiation hardened characteristics of such oxides.

As pointed out previously, because surface 11 of epitaxial layer 10 upon which field oxide layer 21 is formed is an effectively planar surface, the thickness of the field oxide is substantially uniform or constant across the entirety thereof, including the portions immediately adjacent to its sidewalls through which the surfaces of respective well regions 17 and 20 are exposed. Consequently, an overlying metallization layer (to be described below) will encounter the same thickness and the ratio of thickness of deposited oxide to thermally grown oxide therebeneath, so that the hardness characteristics of the field oxide do not deviate across the film including, in particular, the regions of the sidewalls which define a self-aligned PN junction between source and drain regions and the well regions.

Following the formation of the radiation hardened field oxide 21 and thin gate gate oxide 24, a polysilicon layer having a thickness on the order 4K Å is deposited and selectively etched (using a polysilicon photoresist masking layer (not shown)), so as to cover the entire surface of the hardened thin gate oxide layer 24 and a portion of the hardened field oxide layer 21. As will be pointed out below, the substantial thickness to which the polysilicon layer is deposited causes the height of the polysilicon above the planar surface 11 of epitaxial layer 10 to be compatible with the height or thickness of hardened field oxide layer 21. This enables the processing through which subsequent oxide spacers are formed to be simplified so that all oxide spacers may be formed in a single step.

The selective patterning of the deposited polysilicon layer yields a polysilicon gate layer 31 on that portion of the thin gate oxide layer 24 overlying well region 17, and a polysilicon gate layer 32 on that portion of the gate oxide 24 atop the well region 20. In addition, the patterning of the deposited polysilicon layer also leaves a polysilicon layer 34 overlying the hardened field oxide 21 between the N and P wells 17 and 20, respectively.

Next, a P-implant photoresist is selectively formed over the structure exposing polysilicon layer 31 and that portion of N well region 17 exposed by field oxide layer 21. Then, shallow, lightly doped P+ regions are formed in N well regions by a suitable P− impurity (boron) implant at a low implant energy (30 kV), so as to form respective source and drain regions 36 and 37, self-aligned by the polysilicon gate layer 31 atop gate oxide layer 24. For an implant energy of 30 kV, the depth of the peak of the impurity profile of regions 36 and 37 may be on the order of 0.097 μm from the surface 11 of epitaxial layer 10. During this implantation step, boron impurities are blocked by (trapped in) polysilicon gate 31 and effectively partially dope gate 31 to P type.

Figure 4:
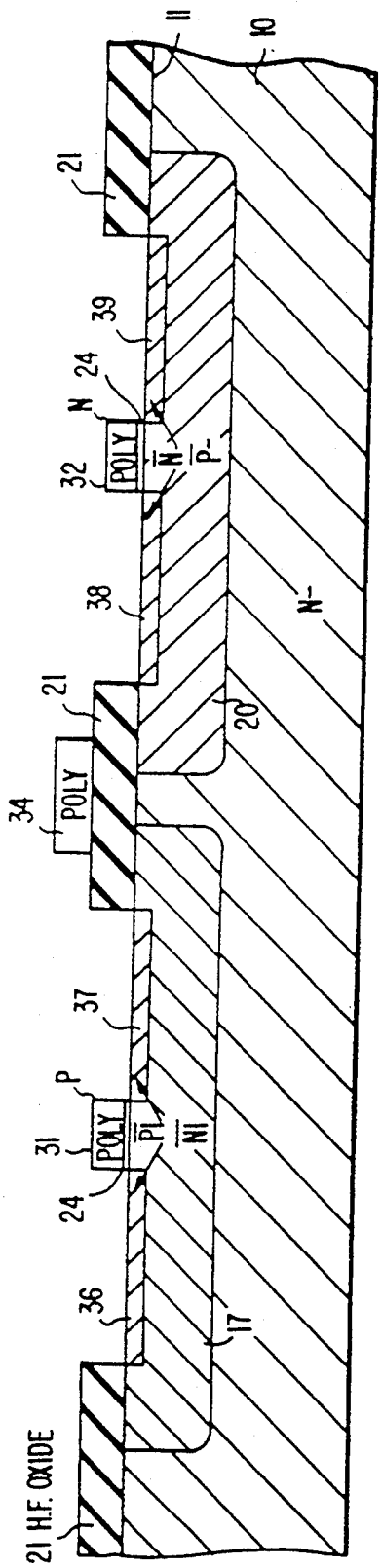

After the formation of the shallow source and drain regions 36 and 37 in well region 17, the P-implant photoresist layer is removed, and an N implant photoresist layer is selectively formed over the structure exposing polysilicon layer 32 and that portion of P well 20 exposed by the hardened field oxide layer 21. The phosphorus ions are then implanted through the photoresist layer to form shallow, lightly-doped source and drain regions 38 and 39 in the surface of P well region 20, self-aligned by polysilicon layer 32 and gate oxide layer 24 thereon. For phosphorus ions, a greater implantation energy (e.g. on the order of 75 kV) is required to achieve a doping peak in well 20 (on the order 0.093 μm) similar to that attained in N well 17, described above. During this implantation step, phosphorus ions that are blocked by (trapped in) polysilicon gate layer 32 and effectively partially dope gate layer 32 to N type. Thereafter, the N type photoresist layer is removed from the surface of the device to leave a configuration as shown in FIG. 4.

Figure 5:
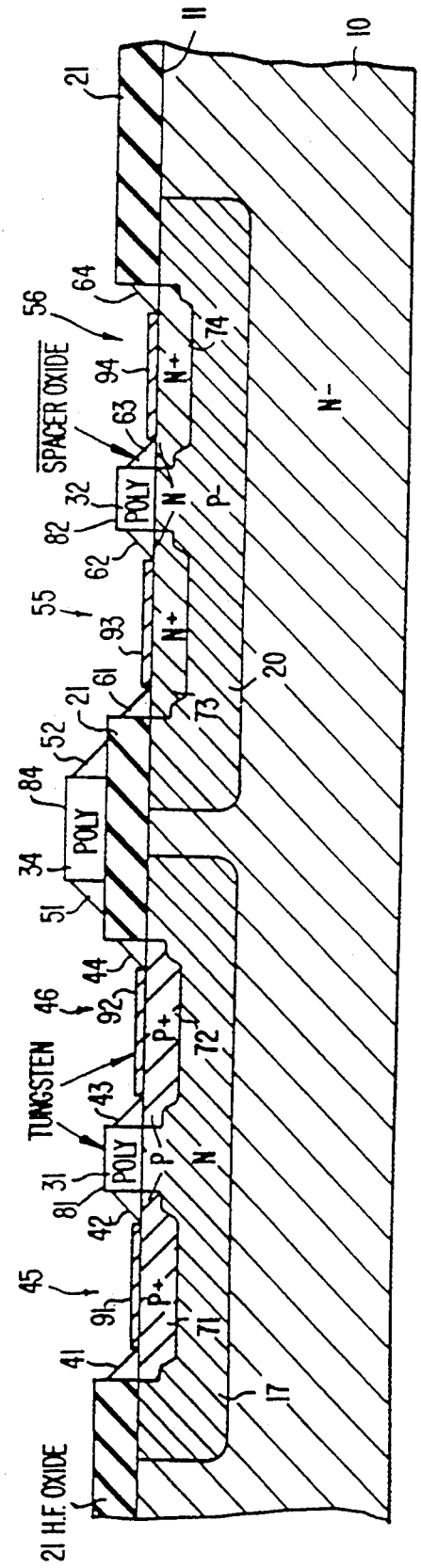

Next, oxide spacers are selectively formed on the exposed surface portion of the source and drain regions adjacent hardened field oxide layer 21 and polysilicon gates. Oxide spacers are also formed on that portion of field oxide layer 21 adjacent to the sidewalls of polysilicon layer 34. As described above, the oxide spacers serve to control the profile of the source and drain regions (through the subsequent introduction of deeper impurities) and serve to insure continuous step coverage of subsequently formed interconnect metal. These oxide spacers are formed by depositing an oxide layer to a thickness on the order of 6 k Å and then anisotropically etching the oxide layer to leave spacers adjacent to the field oxide layer 21 and the polysilicon layers 31, 32 and 34, as shown in FIG. 5. The oxide spacers may be formed by chemical vapor deposition of silicon dioxide over the surface of the structure shown in FIG. 4, and then using reactive ion etching to form respective spacers on the surface of the structure as shown in FIG. 5.

Specifically, spacer 41 extends from a sidewall of the hardened field oxide layer 21 to the surface of lightly doped source region 36, spacer 42 extends from the sidewall of the P doped polysilicon gate layer 31 to the surface of the lightly doped source region 36. Spacer 43 extends from the sidewall of P doped polysilicon gate layer 31 to the surface of lightly doped drain region 37, while spacer 44 which extends from the sidewall of hardened field oxide layer 21 to the surface of lightly doped drain region 37.

Also formed are spacers 51 and 52 which extend from the sidewalls of polysilicon layer 34 to the surface of hardened field oxide layer 21. Additional spacers over the N channel device within P type well region 20 include a spacer 61 which extends from sidewall of hardened field oxide layer 21 to the surface of drain region 38, and a spacer 62 which extends from the sidewall of N doped polysilicon gate layer 32 to the surface of lightly doped drain region 38. Also formed is a spacer 63 which extends from the N-doped polysilicon gate layer 32 to the surface of lightly doped source region 39, and a spacer 64 which extends from the sidewall of the hardened field oxide layer 21 to the surface of lightly doped source region 39.

Following the formation of the oxide spacers, a P+ photoresist layer is selectively formed over the surface of the device to expose that portion of N well region 17 delineated by hardened field oxide 21. P+ ions (e.g. boron ions) are then implanted at a suitable implantation energy (40 kV) to form deep source and drain regions 71 and 72 which extend from the lightly doped source and drain regions 36 and 37, and have a depth defined by the implantation energy and the implantation impeding action of oxide spacers 41, 42 and 43, 44, so that the profiles of the deep source and drain regions 71 and 72 are effectively tapered beneath oxide spacers 41, 42 and oxide spacers 43, 44, respectively, and extend deeper into the N type well region 17 within exposed areas 45 and 46 between spacers 41 and 42 and spacers 43 and 44, respectively.

At the same time that deep source and drain regions 71 and 72 are formed by the introduction of P+ ions, polysilicon layer 31 is more heavily doped with P+ ions, so as to enhance its P conductivity. By selectively doping each of the polysilicon gate layers 31 and 32 in accordance with the channel characteristics of the device therebeneath, the breakdown characteristics of each device are improved. Moreover, improved threshold control beneath polysilicon gate layer 31 for the P channel device is provided.

Following the formation of deep source and drain regions 71 and 72, respectively, in N well region 17, the P+ photoresist layer is removed and an N+ photoresist layer is selectively formed over the surface of the structure to expose windows 55 and 56 and the upper surface of polysilicon layer 32 over P well 20. Suitable N+ impurities (e.g. phosphorus ions) are then implanted into the P well region 20, so as to form deep drain and source regions 73 and 74 beneath windows 55 and 56 and to further enhance the N conductivity of polysilicon layer 32. As in the N well region 17, described above, spacers 61, 62, 63, 64 overlying shallow source and drain regions 38 and 39 in the P well region 20 cause the profiles of the deep source and drain regions 73 and 74 to be tapered therebeneath.

Because of the provision of oxide spacers 41–44 and 61–64, the resulting structure has improved device breakdown characteristics and permits the use of deeper source and drain regions, by spacing the deeper, higher impurity concentration portions of the source and drain regions 71–74 from the polysilicon gates by the lightly doped portions 36, 37, 38 and 39. The spacers also reduce hot electron and substrate current injection problems, as they overlie the lightly doped source and drain regions and separate the polysilicon layers from the more heavily doped portions of the source and drain regions.

After formation of each of the P and N type devices, the N+ photoresist layer for forming deeper regions 73 and 74 and doping polysilicon layer 32 is removed. At this point a rapid thermal anneal (RTA) operation is performed to activate the source and drain implants with minimal side diffusion. Thereafter, a thin layer (1,100 Å) of refractory metal (e.g. tungsten) is selectively deposited over exposed silicon areas. It is formed only on the surface of the silicon; namely, tungsten layers 91, 92, 93 and 94 are formed on source and drains regions 71, 72, 73 and 74, respectively and tungsten layers 81, 82 and 84 are formed on polysilicon layers 31, 32 and 34, respectively.

Because of the provision of the refractory metal over the exposed areas of the source and drain regions and the polysilicon layers, a number of advantages are provided. Since the tungsten extends completely over the exposed areas of the source and drain regions, problems associated with small area source and drain contacts are avoided. In effect, the tungsten acts as a barrier metal for shallow junctions. In addition, the tungsten layers that are provided on the surfaces of the polysilicon layers 31, 32 and 34 greatly reduce the sheet resistance of the polysilicon, thereby enhancing the signal propagation characteristics within the interconnect structure to be formed atop the respective CMOS devices.

Figure 6:
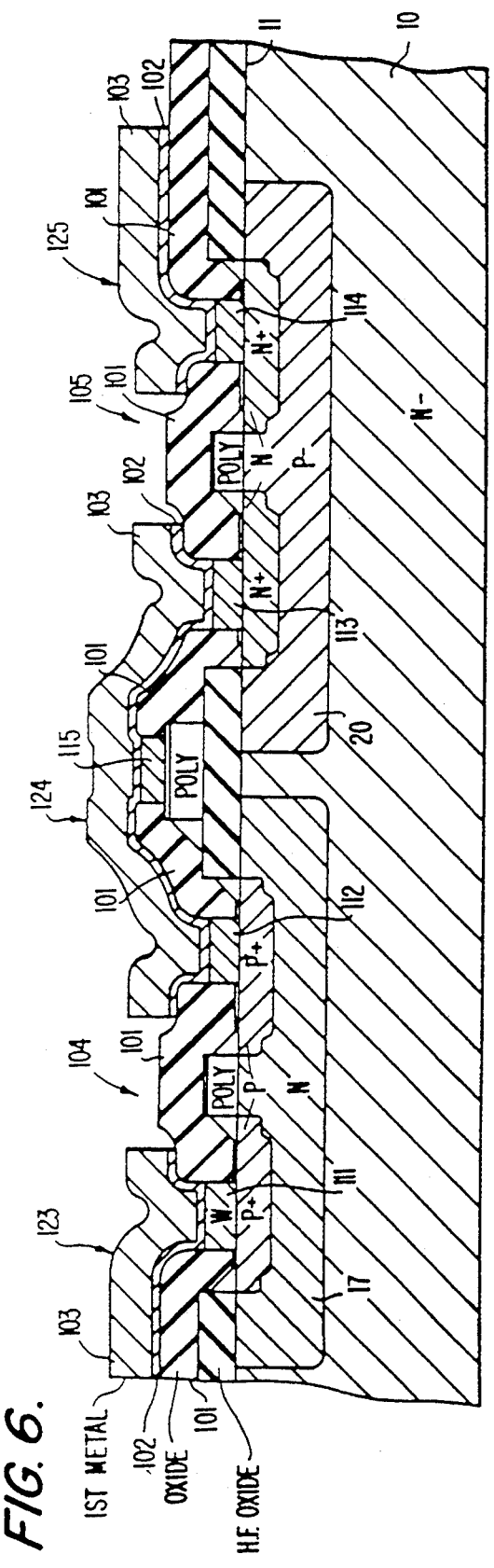

Referring now to FIG. 6, there is shown a first interconnect level of the dual layer interconnect structure to be provided atop the device configuration of FIG. 5, described above. This first interconnect level comprises an oxide layer 101 which is formed atop the entire structure shown in FIG. 5 and then effectively planarized (as through a refill and etch process), followed by the formation of selective openings therein through the use of a contact photoresist and etch, exposing portions of respective tungsten layers 91, 92, 93 and 94 atop the source and drain regions 71, 72, 73 and 74, and tungsten layer 84 atop polysilicon layer 34. The thickness of oxide layer 101 may be on the order of 6 kÅ. Next, tungsten is deposited through the openings in oxide layer 101 to form contact plugs 111, 112, 113, 114 atop tungsten layers 91, 92, 93, 94 respectively and plug 115 atop tungsten layer 84. These contact plugs may extend to a thickness of approximately 4 k Å (or up to 2 k Å from the top surface of the oxide layer 101).

Thereafter, a metal-containing adhesion layer, such as layer containing titanium, having a thickness on the order of 1500 Å, is formed (as by sputtering) over the entire surface of the structure, so as to lie atop and be contiguous with the tungsten contact plugs 111–115 and the oxide layer 101. Atop this metal containing adhesion layer a thin layer of gold is sputtered, to thereby form, with the metal containing adhesion layer, a thin interconnect base layer 102 overlying the entire surface of the semiconductor structure. Next, a layer of photoresist is formed on the sputtered gold layer and a prescribed interconnect pattern is developed in the photoresist to define areas where a gold interconnect layer is to be provided. A thick (e.g. on the order of 5000 Å) gold layer is then electroplated in the openings of the photoresist (using the previously sputtered gold layer 102 as an electroplate bath electrode connection). The photoresist layer is then stripped off and the entire metal structure is exposed to a metal etch which removes an insignificant portion of the surface of the thick electroplated gold layer and the entirety of those portions of the adhesion metal/gold layer 102 that had been previously covered by the stripped photoresist. The resulting plated gold layer is shown in FIG. 6 as a patterned gold interconnect layer 103 having openings 104 and 105 overlying the respective gate regions of the respective CMOS devices, thereby forming a source contact 123 for the source region 71 of the P-channel device, a source contact layer 125 for the source region 74 of the N channel device, and a drain interconnect layer 124 for the drain regions 72 and 73 of the CMOS inverter thereby completing the first level of interconnect structure shown.

Figure 7:
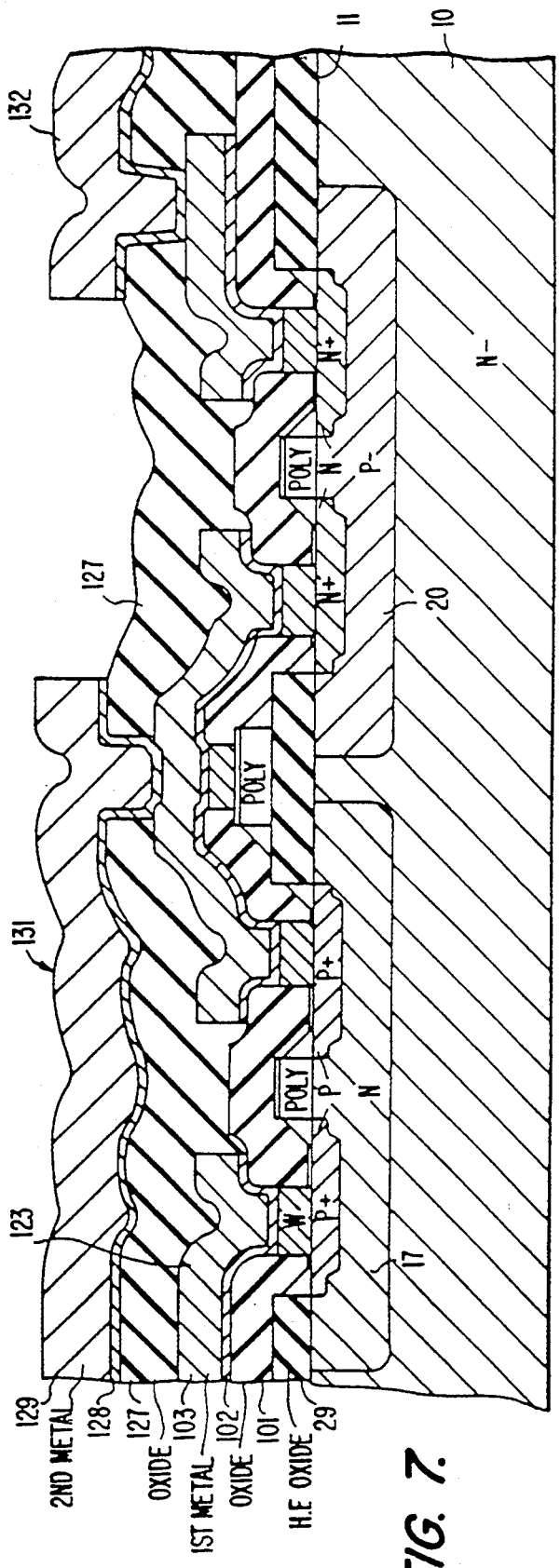

Next, as shown in FIG. 7, an intermediate oxide layer 127 is formed over the entire device and then planarized, as by refill and etch. Oxide layer 127 is then selectively masked to form vias or contact through-holes to drain interconnect layer 124 and source contact layer 125 for the N channel device. A further adhesion metal, gold containing layer 128 is sputtered atop planarization oxide layer 127 and through the apertures therein, so as to contact drain interconnect layer 124 and source contact layer 125 for the N channel MOSFET. This step is followed by the selective plating (as by using the photoresist patterning process described above for the selective electroplating of layer 103) of a second level interconnect metal (e.g. gold) layer 129 atop layer 128. After removal of the gold electroplate patterning photoresist, the gold layer 129 and exposed layer 128 are etched, so as to remove layer 128 from those areas previously covered by photoresist. (This etch also removes an insignificant amount of the surface of gold layer 129.) This etching step produces the dual level interconnect structure shown in FIG. 7 having respective contact layers 123, 131 and 132 for the source of the P-channel device, the connected drains of the complementary pair and the source of the N channel device. The final structure is then covered with an overlying passivation oxide layer and a (substrate) backside metal (e.g. gold) layer (not shown) to complete the inverter structure.

By providing the double level metal (gold) interconnect structure shown in FIGS. 6 and 7 several advantages are obtained. By virtue of the refractory metal-adhesion metal-plated gold interconnect, improved packing density and a lower resistance and a lower capacitance than a dual polysilicon layer are afforded. Due to the electroplating of gold to form the first and second interconnect layers (layers 103 and 129), improved step coverage, reduced resistance, and improved electromigration characteristics are obtained.

As will be appreciated from the foregoing description, the improved processing methodology of the present invention provides CMOS inverter configuration that is especially suited for very high speed radiation hardened integrated circuit applications, the devices being formed in a radiation-hardened twin well structure. The source and drain regions are self-aligned with refractory metal on both the gates and source/drain regions assisting in the application of the highly densified multilevel interconnect structure.

While I have shown and described an embodiment in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed is:

1. A method of forming complementary insulated gate field effect transistors comprising the steps of:
   (a) providing a semiconductor body having in a planar surface thereof a first region of a first conductivity type and a second region of a second conductivity type; (b) selectively forming a field insulator layer on said planar surface so as to expose a surface portion of said first region and a surface portion of said second region;
   (c) forming first and second gate insulator layers on said surface portion of said first region and on said surface portion of said second region, respectively;
   (d) forming first and second gates on said first and second gate insulator layers, respectively;
   (e) introducing impurities of said second conductively type into said first region using said first gate as a mask to form shallow source and drain regions therein;
   (f) introducing impurities of said first conductivity type into said second region using said second gate as a mask to form shallow source and drain regions therein;
   (g) forming insulative spacers extending laterally from said first and second gates and from said field insulator layer over said source and drain regions;
   (h) introducing impurities of said second conductivity type into said first gate, and into said first region using said first gate and spacers as a mask to form deep source and drain regions therein having a depth and an impurity concentration greater than said shallow source and drain regions therein;
   (i) introducing impurities of said first conductivity type into said second gate, and into said second region using said second gate and spacers as a mask to form deep source and drain regions therein having a depth and an impurity concentration greater than said shallow source and drain regions therein;
   (j) selectivity forming a thin metal layer on said source and drain regions and on said first and second gates;
   (k) selectively forming an insulator layer over said surface to expose portions of said thin metal layer;
   (l) forming interconnect contacts to the exposed portions of said thin metal layer by:
      forming thick metal plugs in apertures in said insulator layer formed in step (k), said thick metal plugs containing the metal of said thin metal layer;
      forming a thin adhesion metal layers over said insulator layer and said thick metal plugs; and
      forming an interconnect metal layer over said transition metal layer.

2. A method of forming complementary insulated gate field effect transistors comprising the steps of:
   (a) providing a semiconductor body having in a planar surface thereof a first region of a first conductivity type and a second region of a second conductivity type;
   (b) selectively forming a field insulator layer on said planar surface so as to expose a surface portion of said first region and a surface portion of said second region;
   (c) forming first and second gate insulator layers on said surface portion of said first region and on said surface portion of said second region, respectively;
   (d) forming first and second gates on said first and second gate insulator layers, respectively;
   (e) introducing impurities of said second conductivity type into said first region using said first gate as a mask to form shallow source and drain regions therein;
   (f) introducing impurities of said first conductivity type into said second region using said second gate as a mask to form shallow source and drain regions therein;
   (g) forming insulative spacers extending laterally from said first and second gates and from said field insulator layer over said source and drain regions;
   (h) introducing impurities of said second conductivity type into said first gate, and into said first region using said first gate and spacers as a mask to form deep source and drain regions therein having a depth and an impurity concentration greater than said shallow source and drain regions therein;

(i) introducing impurities of said first conductivity type into said second gate, and into said second region using said second gate and spacers as a mask to form deep source and drain regions therein having a depth and an impurity concentration greater than said shallow source and drain regions therein;

(j) selectively forming a thin metal layer on said source and drain regions and on said first and second gates;

(k) selectively forming an insulator layer over said surface to expose portions of said thin metal layer; and (l) forming interconnect contacts to the exposed portions of said thin metal layer by forming a multilevel interconnect metal layer-insulator structure to selected ones of the exposed portions of said thin metal layer.

3. A method according to claim 2, wherein the interconnect metal of said multilevel interconnects metal layer-insulator structure comprises plated metal.

4. A method according to claim 3, wherein said plated metal includes electroplated gold.

5. A method according to claim 2, wherein said step (l) further includes the steps of:

forming thick metal plugs in apertures in said insulator layer formed in step (k), said thick metal plugs containing the metal of said thin metal layer;

forming a first thin adhesion metal layer over said insulator layer and said thick metal plugs;

forming a first interconnect metal layer over said first adhesion metal layer, thereby forming a first interconnect layer structure;

selectively forming a further insulator layer over said first interconnect layer to expose portions of said first interconnect layer;

forming a second thin adhesion metal layer over said further insulator layer and through apertures therein into contact with exposed portions of said first interconnect metal layer; and forming a second interconnect metal layer over said second adhesion metal layer, thereby forming a second interconnect layer structure.

6. A method according to claim 5, wherein steps (k) and (l) include forming said insulator layer and said further insulator layer as effective planarized insulator layers.

7. A method of forming complementary insulated gate field effect transistors comprising the steps of:

(a) providing a semiconductor body having a planar surface thereof a first region of a first conductivity type and a second region of a second conductivity type;

(b) selectively forming a field insulator layer on said planar surface so as to expose a surface portion of said first region and a surface portion of said second region;

(c) forming first and second gate insulator layers on said surface portion of said first region and on said surface portion of said second region, respectively;

(d) forming first and second gates on said first and second gate insulator layers, respectively;

(e) introducing impurities of said second conductivity type into said first region using said first gate as a mask to form shallow source and drain regions therein;

(f) introducing impurities of said first conductivity type into said second region using said second gate as a mask to form shallow source and drain regions therein;

(g) forming insulative spacers extending laterally from said first and second gates and from said field insulator layer over said source and drain regions;

(h) introducing impurities of said second conductivity type into said first gate, and into said first region using said first gate and spacers as a mask to form deep source and drain regions therein having a depth and an impurity concentration greater than said shallow source and drain regions therein;

(i) introducing impurities of said first conductivity type into said second gate, and into said second region using said second gate and spacers as a mask to form deep source and drain regions therein having a depth and an impurity concentration greater than said shallow source and drain regions therein; and wherein said field insulator layer is effectively hardened against radiation such that said field insulator layer exhibits a flat-band voltage shift thereacross no greater than 20 volts over a total radition dose range of at least $10^5$ rads;

said field insulator layer comprises a laminated structure of a thermally grown insulator layer and a deposited insulator layer thereon;

said body of semiconductor material comprises a silicon body and said laminated structure comprises a first layer of silicon dioxide thermally grown on said effectively planar surface of said silicon body and a second layer of chemically vapor deposited phosphosilicate glass atop said first layer of silicon dioxide;

step (d) includes forming a layer of material of which said first and second gates are made on said radiation hardened field insulator layer;

and further comprising the steps of:

(j) selectively forming a thin metal layer on said source and drain regions and on said first and second gates;

(k) selectively forming an insulator layer over said surface to expose portions of said thin metal layer; and (l) forming interconnect contacts to the exposed portions of said thin metal layer; and wherein step (j) includes forming said thin metal layer on the layer of material formed in step (d); and wherein step (l) includes the steps of forming thick metal plugs in apertures in said insulator layer formed in step (k), said thick metal plugs containing the metal of said thin metal layer;

forming a thin adhesion metal layer over said insulator layer and said thick metal plugs; and forming an interconnect metal layer over said adhesion metal layer.

8. A method according to claim 7, wherein said adhesion metal layer is formed so as to interconnect the plugs to the thin metal layers overlying said drain regions and the layer of material formed in step (d).

9. A method according to claim 8, wherein said thin metal layer is a layer of refractory metal.

10. A method according to claim 9, wherein said gates are formed of polycrystalline semiconductor material.

11. A method according to claim 10, wherein step (b) comprises forming a radiation hardened oxide layer and direct moat etching said oxide layer to prescribe said first and second surface areas.

12. A method of forming complementary insulated gate field effect transistors comprising the steps of:
  (a) providing a semiconductor body having in a planar surface thereof a first region of a first conductivity type and a second region of a second conductivity type;
  (b) selectively forming a field insulator layer on said planar surface so as to expose a surface portion of said first region and a surface portion of said second region;
  (c) forming first and second gate insulator layers on said surface portion of said first region and on said surface portion of said second region, respectively;
  (d) forming first and second gates on said first and second gate insulator layers, respectively;
  (e) introducing impurities of said second conductivity type into said region using said first gate as a mask to form shallow source and drain regions therein;
  (f) introducing impurities of said first conductivity type into said second region using said second gate as a mask to form shallow source and drain regions therein;
  (g) forming insulative spacers extending laterally from said first and second gates and from said field insulator layer over said source and drain regions;
  (h) introducing impurities of said second conductivity type into said first gate, and into said first region using said first gate and spacers as a mask to form deep source and drain regions therein having a depth and an impurity concentration greater than said shallow source and drain regions therein;
  (i) introducing impurities of said first conductivity type into said second gate, and into said second region using said second gate and spacers as a mask to form deep source and drain regions therein having a depth and an impurity concentration greater than said shallow source and drain regions therein; and wherein
  said field insulator layer is effectively hardened against radiation such that said field insulator layer exhibits a flat-band voltage shift thereacross no greater than 20 volts over a total radiation dose range of at least $10^5$ rads;
  said field insulator layer comprises a laminated structure of a thermally grown insulator layer and a deposited insulator layer thereon;
  said body of semiconductor material comprises a silicon body and said laminated structure comprises a first layer of silicon dioxide thermally grown on said effectively planar surface of said silicon body and a second layer of chemically vapor deposited phosphosilicate glass atop said first layer of silicon dioxide;
  step (d) includes forming a layer of material of which said first and second gates are made on said radiation hardened field insulator layer; and wherein
  step (g) includes forming insulator spacers extending laterally from said layer of material onto said radiation hardened field insulator layer.

13. A method of forming complementary insulated gate field effect transistors comprising the steps of:
  (a) providing a semiconductor body having in a planar surface thereof a first region of a first conductivity type and a second region of a second conductivity type;
  (b) selectively forming a field insulator layer on said planar surface so as to expose a surface portion of said first region and a surface portion of said second region;
  (c) forming first and second gate insulator layers on said surface portion of said first region and on said surface portion of said second region, respectively;
  (d) forming first and second gates on said first and second gate insulator layers, respectively;
  (e) introducing impurities of said second conductivity type into said first region using said first gate as a mask to form shallow source and drain regions therein;
  (f) introducing impurities of said first conductivity type into said second region using said second gate as a mask to form shallow source and drain regions therein;
  (g) forming insulative spacers extending laterally from said first and second gates and from said field insulator layer over said source and drain regions;
  (h) introducing impurities of said second conductivity type into said first gate, and into said first region using said first gate and spacers as a mask to form deep source and drain regions therein having a depth and an impurity concentration greater than said shallow source and drain regions therein;
  (i) introducing impurities of said first conductivity type into said second gate, and into said second region using said second gate and spacers as a mask to form deep source and drain regions therein having a depth and an impurity concentration greater than said shallow source and drain regions therein; and
  (j) subjecting the source and drain regions formed in steps (h) and (i) to a rapid thermal anneal treatment.

14. A method of forming complementary insulated gate field effect transistors comprising the steps of:
  (a) forming, in a planar surface of semiconductor material, a first well region of a first conductivity type and a second well region of a second conductivity type each of said well regions having retrograde impurity distribution profiles therein;
  (b) selectively forming an insulator layer comprising a first relatively thick field insulator portion prescribing respective first and second surface areas of said first and second well regions, and first and second relatively thin gate insulator portions within said surface areas, respectively;
  (c) forming respective first and second gates on said first and second relatively thin portions of said insulator layer;
  (d) forming insulative spacers extending laterally from said first and second gates and from said relatively thick field insulator portions of said insulator layer over said first and second surface areas;
  (e) introducing impurities of said second conductivity type into said first surface area of said first well region, using said first gate and spacers as a mask to form source and drain regions;
  (f) introducing impurities of said first conductivity type into said second surface area of said second well region, using said second gate and spacers as a mask to form source and drain regions therein;

(g) forming a thin metal layer on said source and drain regions and on said first and second gates;

(h) selectively forming an insulator layer over said surface to expose portions of said thin metal layer; and (i) forming interconnect contacts to the exposed portions of said thin metal layer by forming a multi-level interconnect metal layer insulator structure to selected ones of exposed portions of said thin metal layer.

15. A method of forming complementary insulated gate field effect transistors comprising the steps of:

(a) forming, in a planar surface of semiconductor material, a first well region of a first conductivity type and a second well region of a second conductivity type each of said well regions having retrograde impurity distribution profiles therein;

(b) selectively forming an insulator layer comprising a first relatively thick field insulator portion prescribing respective first and second surface areas of said first and second well regions, and first and second relatively thin gate insulator portions within said surface areas, respectively;

(c) forming respectively first and second gates on said first and second relatively thin portions of said insulator layer;

(d) forming insulative spacers extending laterally from said first and second gates and from said relatively thick field insulator portions of said insulator layer over said first and second surface areas;

(e) introducing impurities of said second conductivity type into said first surface area of said first well region, using said first gate and spacers as a mask to form source and drain regions; and (f) introducing impurities of said first conductivity type into said second surface area of said second well region, using said second gate and spacers as a mask to form source and drain regions therein; and wherein step (c) includes forming a layer of material of which said first and second gates are made on said first relatively thick field insulator portion of said insulator layer.

16. A method according to claim 15, further comprising the steps of:

(g) forming a thin metal layer on said source and drain regions and on said first and second gates;

(h) selectively forming an insulator layer over said surface to expose portions of said thin metal layer; and (i) forming interconnect contacts to the exposed portions of said thin metal layer.

17. A method according to claim 16, wherein step (g) includes forming said thin metal layer on said layer of material formed in step (c).

18. A method according to claim 17, wherein step (i) includes the steps of forming thick metal plugs in apertures in said insulator layer formed in step (h), said thick metal plugs containing the metal of said thin metal layer, forming a thin adhesion metal layer over said insulator layer and said thick metal plugs, and forming an interconnect metal layer over said adhesion metal layer.

19. A method according to claim 18, wherein said interconnect metal layer is formed by plating said interconnect metal layer.

20. A method according to claim 18, wherein said adhesion metal layer is formed so as to interconnect the metal plugs to the thin metal layers overlying said drain regions and the layer of material formed in step (c).

21. A method according to claim 20, wherein said thin metal layer is a layer of refractory metal.

22. A method according to claim 21, wherein said gates are formed of polycrystalline semiconductor material.

23. A method according to claim 15, wherein step (d) includes forming insulator spacers extending laterally from said layer of material onto said relatively thick field insulator portion of said insulator layer therebeneath.

24. A method of forming complementary insulated gate field effect transistors comprising the steps of:

(a) forming, in a planar surface of semiconductor material, a first well region of a first conductivity type and a second well region of a second conductivity type each of said well regions having retrograde impurity distribution profiles therein;

(b) selectively forming an insulator layer comprising a first relatively thick field insulator portion prescribing respective first and second surface areas of said first and second well regions, and first and second relatively thin gate insulator portions within said surface areas, respectively;

(c) forming respective first and second gates on said first and second relatively thin portions of said insulator layer;

(d) forming insulative spacers extending laterally from said first and second gates and from said relatively thick field insulator portions of said insulator layer over said first and second surface areas;

(e) introducing impurities of said second conductivity type into said first surface area of said first well region, using said first gate and spacers as a mask to form source and drain regions;

(f) introducing impurities of said first conductivity type into said second surface area of said second well region, using said second gate and spacers as a mask to form source and drain regions therein; and (g) subjecting the source and drain regions formed in steps (e) and (f) to a rapid thermal anneal treatment.

* * * * *